(12) United States Patent
Lin et al.

(10) Patent No.: US 8,471,973 B2
(45) Date of Patent: Jun. 25, 2013

(54) PIXEL DESIGNS OF IMPROVING THE APERTURE RATIO IN AN LCD

(75) Inventors: Hsiang-Lin Lin, Hsinchu (TW);
Ching-Huan Lin, Hsinchu (TW);
Chih-Hung Shih, Hsinchu (TW);
Wei-Ming Huang, Hsinchu (TW);
Chih-Hung Lin, Hsinchu (TW);
Yu-Cheng Chen, Hsinchu (TW); Yi-Hui Li, Hsinchu (TW); Tsan-Chun Wang, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 433 days.

(21) Appl. No.: 12/788,876

(22) Filed: May 27, 2010

(65) Prior Publication Data

US 2010/0315583 A1    Dec. 16, 2010

Related U.S. Application Data

(63) Continuation-in-part of application No. 12/483,390, filed on Jun. 12, 2009, now Pat. No. 8,179,490.

(51) Int. Cl.
*G02F 1/36* (2006.01)
(52) U.S. Cl.
USPC .............................................. 349/44; 349/43
(58) Field of Classification Search
USPC .................................................. 349/43, 444
See application file for complete search history.

(56) References Cited

U.S. PATENT DOCUMENTS

| | | | |
|---|---|---|---|
| 5,724,107 A * | 3/1998 | Nishikawa et al. | 349/38 |
| 5,777,701 A | 7/1998 | Zhang | |
| 5,835,169 A | 11/1998 | Kwon et al. | |
| 6,118,506 A | 9/2000 | Yamazaki et al. | |
| 6,124,904 A | 9/2000 | Sato | |
| 6,531,713 B1 * | 3/2003 | Yamazaki | 257/59 |
| 7,095,046 B2 * | 8/2006 | Ishikawa | 257/59 |
| 7,142,260 B2 | 11/2006 | Yang | |
| 7,391,055 B1 * | 6/2008 | Murakami et al. | 257/72 |
| 7,515,217 B2 | 4/2009 | Yang | |
| 7,804,569 B2 * | 9/2010 | Sohn et al. | 349/139 |
| 7,907,227 B2 * | 3/2011 | Oh | 349/44 |
| 8,023,042 B2 * | 9/2011 | Yamazaki et al. | 348/552 |
| 8,305,507 B2 * | 11/2012 | Ryu et al. | 349/39 |

(Continued)

FOREIGN PATENT DOCUMENTS

| | | |
|---|---|---|
| CN | 1837936 A | 9/2006 |
| TW | I226712 B | 1/2005 |

*Primary Examiner* — Kaveh Kianni
(74) *Attorney, Agent, or Firm* — Morris Manning & Martin LLP; Tim Tingkang Xia, Esq.

(57) ABSTRACT

This invention in one aspect relates to a pixel structure. In one embodiment, the pixel structure includes a scan line formed on a substrate and a data line formed over the substrate defining a pixel area, a switch formed inside the pixel area on the substrate, a shielding electrode formed over the switch, a plane organic layer formed over the date line and the pixel area and having no overlapping with the shielding electrode, and a pixel electrode having a first portion and a second portion extending from the first portion, and formed over the shielding electrode and the plane organic layer in the pixel area, wherein the first portion is overlapped with the shielding electrode so as to define a storage capacitor therebetween, and the second portion overlays the plane organic layer and has no overlapping with the data line.

12 Claims, 8 Drawing Sheets

U.S. PATENT DOCUMENTS

| | | | |
|---|---|---|---|
| 8,314,426 B2 * | 11/2012 | Kokubo et al. | 257/59 |
| 2002/0088982 A1 | 7/2002 | Gu et al. | |
| 2003/0116768 A1 * | 6/2003 | Ishikawa | 257/79 |
| 2003/0122158 A1 | 7/2003 | Murade | 257/200 |
| 2003/0201439 A1 * | 10/2003 | Yamazaki et al. | 257/59 |
| 2004/0036071 A1 * | 2/2004 | Yamazaki et al. | 257/59 |
| 2004/0147065 A1 * | 7/2004 | Kitakado et al. | 438/151 |
| 2004/0188692 A1 * | 9/2004 | Ishikawa | 257/79 |
| 2005/0122458 A1 | 6/2005 | Yang | |
| 2005/0180232 A1 | 8/2005 | Arao | |
| 2005/0269639 A1 * | 12/2005 | Yamazaki et al. | 257/350 |
| 2006/0192906 A1 * | 8/2006 | Ryu et al. | 349/43 |
| 2006/0215071 A1 | 9/2006 | Shin et al. | |
| 2006/0226426 A1 * | 10/2006 | Park et al. | 257/59 |
| 2007/0195213 A1 * | 8/2007 | Oh | 349/38 |
| 2008/0023717 A1 * | 1/2008 | Choi et al. | 257/98 |
| 2008/0111138 A1 * | 5/2008 | Lin et al. | 257/79 |
| 2008/0227242 A1 * | 9/2008 | Tsai et al. | 438/158 |
| 2010/0019998 A1 * | 1/2010 | You et al. | 345/87 |
| 2011/0025923 A1 * | 2/2011 | Tsubata | 348/731 |

* cited by examiner

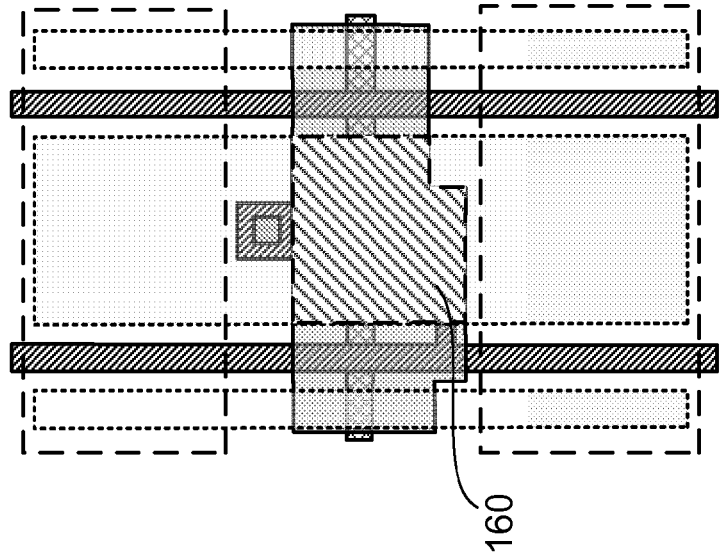
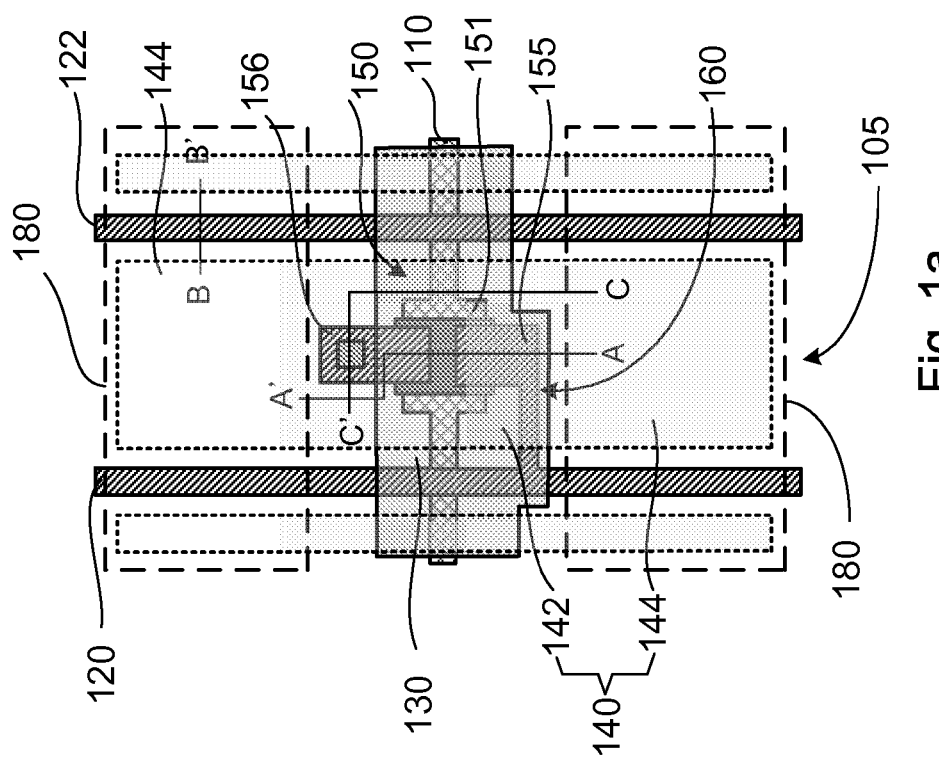
Fig. 1b
Fig. 1a

240

200

PIXEL DESIGNS OF IMPROVING THE APERTURE RATIO IN AN LCD

CROSS-REFERENCE TO RELATED PATENT APPLICATION

This application is a continuation-in-part of U.S. patent application Ser. No. 12/483,390, filed Jun. 12, 2009, entitled "PIXEL DESIGNS OF IMPROVING THE APERTURE RATIO IN AN LCD" by Lin et al., the disclosure of the above identified co-pending application is incorporated herein by reference in its entirety.

Some references, if any, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference.

FIELD OF THE INVENTION

The present invention relates generally to a liquid crystal display (LCD), and more particularly, to an LCD that utilizes a pixel design to improve the aperture ratio thereof and methods of fabricating same.

BACKGROUND OF THE INVENTION

A liquid crystal display (LCD) device includes an LCD panel formed with liquid crystal cells and pixel structures with each associating with a corresponding liquid crystal cell and having a scan line, a data line, a pixel electrode, and a switch having a gate, a source and a drain electrically connected to the scan line, the data line and the pixel electrode, respectively. Generally, an aperture ratio of pixels directly affects utilization of backlight and panel brightness of an LCD. In a pixel structure, a parasitic capacitance, between the pixel electrode and the data line is one of major factors affecting the aperture ratio. The parasitic capacitance is determined by the distance between the pixel electrode and the data line. The closer the pixel electrode and the data line are, the larger the parasitic capacitance is. However, when the pixel electrode and the data line are too close, a cross talk may be generated by the coupling effect between the charged potential on the pixel electrode and the signal voltages transmitted in the data line, which deteriorates the display quality of the LCD. Generally, the data line is always designed to be separated from the pixel electrode for a distance so as to avoid the cross talk. However, the longer the distance between the data line and the pixel electrode is, the more greatly the aperture ratio of the pixel decreases.

To reduce the cross talk of the pixel structure and maintain the aperture ratio of the pixel structure at a certain level, various designs of pixel structures have been developed. For example, one of the pixel designs is the utilization of a shielding electrode disposed between the pixel electrode and the data line to reduce the effect of the parasitic capacitance. As shown in FIG. 5, in the pixel design, the shielding electrode 540 is formed over the date line 520 and the switch 550, but under the pixel electrode 510, such that the shielding electrode 540 has an area 560 that is overlapped with the peripheral portion of the pixel electrode 510. For such a pixel design, the overlapped area 560 of the shielding electrode 540 with the peripheral portion of the pixel electrode 510 is configured to generate a storage capacitance therebetween, thereby improving the aperture ratio thereof, in comparison with a pixel design without a shielding electrode. However, the shielding electrode 540 is usually formed of an opaque conductive material because of impedance. Thus, the use of the overlapped area 560 of the shielding electrode 540 with the peripheral portion of the pixel electrode 510 to generate the storage capacitance itself reduces certain amounts of the aperture ratio.

Additionally, some pixel designs also utilize a comb-like pixel electrode 610 to assist with the orientations of liquid crystals, as shown in FIG. 6. In the pixel design 600, the storage capacitance area 660 formed by overlapping the shielding electrode 640 with the peripheral portion of the pixel electrode 610 is reduced because of the comb-like structure of the pixel electrode 610. Increasing the storage capacitance area, thereby increasing the storage capacitance, will reduce the aperture ratio.

Therefore, a heretofore unaddressed need exists in the art to address the aforementioned deficiencies and inadequacies.

SUMMARY OF THE INVENTION

The present invention, in one aspect, relates to a pixel structure usable in a liquid crystal display (LCD). In one embodiment, the pixel structure has a scan line formed on a substrate and a data line formed over the substrate, and a pixel area associated with the data line and the scan line. The pixel structure also has a switch formed inside the pixel area on the substrate.

The pixel structure also has a shielding electrode formed over the switch. In one embodiment, the shielding electrode is made of an opaque, conductive material.

Furthermore, the pixel structure has a plane organic layer formed over the date line and the pixel area and having no overlapping with the shielding electrode. The plane organic layer is the plane organic layer is adapted for reducing parasitic capacitance induced by the data line, and formed of an organic material having a dielectric constant in a range of about 0.5-3.7.

Additionally, the pixel structure has a pixel electrode having a first portion and a second portion extending from the first portion, and formed over the shielding electrode and the plane organic layer in the pixel area, wherein the first portion is overlapped with the shielding electrode so as to define a storage capacitor therebetween, and the second portion overlays the plane organic layer and has no overlapping with the data line. In one embodiment, the pixel electrode has a comb-like shape. The pixel electrode is made of a transparent, conductive material.

The pixel structure also has a first insulation layer formed between the scan line and the data line, a second insulation layer formed between the data line and the shielding electrode; and a third insulation layer formed between the shielding electrode and the pixel electrode.

The switch has a gate, a source and a drain electrically connected to the scan line, the data line and the pixel electrode, respectively. The gate of the switch is formed on the substrate, and the source and drain of the switch are formed between the first insulation layer and the second insulation layer.

In one embodiment, the switch further includes a semiconductor layer formed between the source and drain and the first insulation layer. The semiconductor layer includes a channel layer formed on the first insulation layer and an ohmic contact layer formed on the channel layer. In one embodiment, the channel layer a formed of amorphous silicon (a-Si), and the ohmic contact layer is formed of an $N^+$ doped or CVD deposited semiconductor. The switch is corresponding to a thin film transistor (TFT).

In another aspect, the present invention relates to a liquid crystal display (LCD) comprising a plurality of the pixel structures, arranged in a matrix.

In yet another aspect, the present invention relates to method for fabricating a pixel structure. In one embodiment, the method includes the following steps: at first, a substrate is provided. A scan line and a gate electrode are formed on the substrate. The gate electrode is formed to be electrically connected to the scan line. Then, a first insulation layer is formed on the substrate, which overlays the scan line and the gate electrode.

Then, a semiconductor layer is formed on the first insulation layer and overlapped with the gate electrode. In one embodiment, the step of forming the semiconductor layer may comprises the steps of forming a channel layer on the first insulation layer, forming an ohmic contact layer on the channel layer, and patterning the channel layer and the ohmic contact layer to form the semiconductor layer, where the ohmic contact layer is patterned to have a first portion and a second portion separated from the first portion. Next, a data line is formed on the first insulation layer. Meanwhile, a source electrode and a drain electrode are formed on the first portion and the second portion of the ohmic contact layer, respectively. In alternative steps, after forming the channel layer and the ohmic contact layer, a step of pre-patterning the channel layer and the ohmic contact layer can be performed to define the shape of the channel layer. A step of patterning the channel layer and the ohmic contact layer can be performed after forming the source electrode and the drain electrode, wherein the ohmic contact layer is patterned to have a first portion and a second portion separated from the first portion, and the source electrode and the drain electrode are substantially in contact with the first portion and the second portion of the ohmic contact layer, respectively. In further alternative steps, a half-tone process is employed, the step of patterning the channel layer and the ohmic contact layer can be performed after forming the source electrode and the drain electrode with a half-tone mask, wherein the ohmic contact layer is patterned to have a first portion and a second portion separated from the first portion, and the source electrode and the drain electrode are substantially in contact with the first portion and the second portion of the ohmic contact layer, respectively. The gate electrode, the channel layer, the ohmic contact layer, the source electrode and the drain electrode define a switch.

The next step is to form a second insulation layer on the first insulation layer, which overlays the data line and the switch. A shielding electrode is formed on the second insulation layer and over the switch.

Next, a third insulation layer is formed on the second insulation layer, which overlays the shielding electrode. A plane organic layer is sequentially formed on the third insulation layer such that the plane organic layer is positioned over the date line and the pixel area, and has no overlapping with the shielding electrode. The step of forming the plane organic layer may include etching off the portion of the plane organic layer over the shielding electrode, so that the plane organic layer has no overlapping with the shielding electrode. The plane organic layer includes an organic material having a dielectric constant in a range of about 0.5-3.7.

Then, a pixel electrode is formed on the third insulation layer and the plane organic layer, wherein the pixel electrode has a first portion overlapped with the shielding electrode so as to define a storage capacitor therebetween, and a second portion extending from the first portion overlying the plane organic layer and having no overlapping with the shielding electrode.

The source electrode and the drain electrode of the switch are electrically connected to the data line and the pixel electrode, respectively.

The channel layer a formed of amorphous silicon (a-Si), and wherein the ohmic contact layer is formed of an $N^+$ doped or CVD deposited semiconductor.

In one embodiment, the shielding electrode comprises an opaque, conductive material.

The pixel electrode has a comb-like shape. The pixel electrode is made of a transparent, conductive material.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, wherein:

FIGS. 1*a*-1*c* show schematically a top view, a top view with highlighting a storage capacitance, and a cross-sectional view of a pixel structure, respectively, according to one embodiment of the present invention;

DETAILED DESCRIPTION OF THE INVENTION

Figure 1C:
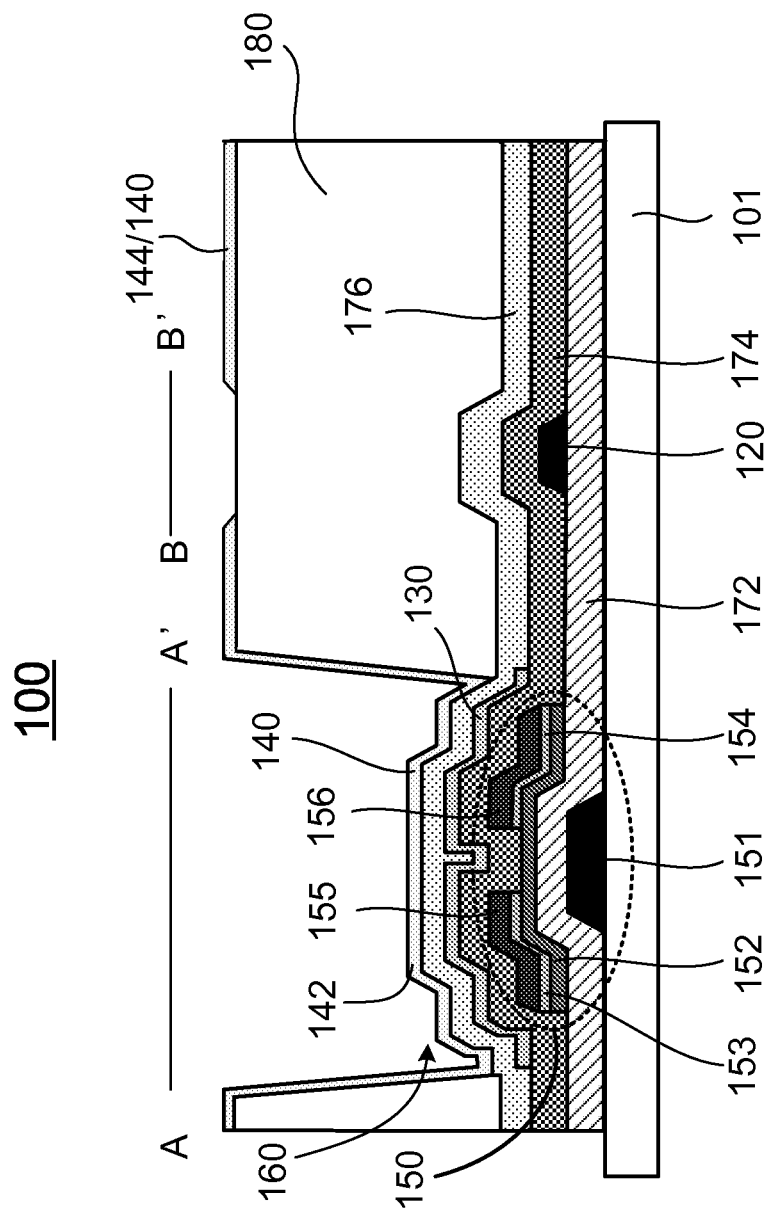

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "having," "containing," "involving," and the like are to be understood to be open-ended, i.e., to mean including but not limited to.

The description will be made as to the embodiments of the present invention in conjunction with the accompanying drawings in FIGS. 1-4. In accordance with the purposes of this invention, as embodied and broadly described herein, this invention, in one aspect, relates to a pixel structure, and a liquid crystal display (LCD) comprising a plurality of the pixel structures, arranged in a matrix.

Referring to FIGS. 1a-1c, the pixel structure 100 has a scan line 110 and a data line 120, a pixel area 105 defined between the data line 120 and the data line 122 of its adjacent pixel structure (not shown), a switch 150, a shielding electrode 130, a plane organic layer 180 and a pixel electrode 140. The switch 150 and the pixel electrode 140 are formed inside the pixel area 105. The pixel structure 100 further has a first insulation layer 172, the second insulation layer 174 and the third insulation layer 176. The switch 150 has a gate electrode 151, a source electrode 155 and a drain electrode 156 electrically connected to the scan line 110, the data line 120 and the pixel electrode 140, respectively. Additionally, the switch 150 also includes a channel layer 152, an ohmic contact layer 153/154 formed between the gate electrode 151 and the source electrode 155 and the drain electrode 156. In one embodiment, the channel layer 152 is formed of amorphous silicon (a-Si), and the ohmic contact layer 153/154 is formed of an N+ doped or CVD deposited semiconductor. The switch 150 is corresponding to a thin film transistor (TFT).

The gate electrode 151, the data line 120 and the scan line 110 are spatially formed on the substrate 101. The gate electrode 151 defines a switch area therearound. The first insulation layer 172 is formed on the substrate 101 and overlays the scan line 110 and the gate electrode 151. The channel layer 152 is formed on the first insulation layer 172. The channel layer 152 layer is overlapped with the gate electrode 151. The ohmic contact layer 153/154 is formed on the channel layer 152. The ohmic contact layer 153/154 has a first portion 153 and a second portion 154 separated from the first portion 153. The data line 120 and the source electrode 155 and the drain electrode 156 are formed simultaneously. The source electrode 155 and the drain electrode 156 are formed on the first portion 153 and the second portion 154 of the ohmic contact layer 153/154, respectively.

The second insulation layer 174 is formed on the first insulation layer 172 and overlays the data line 120 and the switch 150. The shielding electrode 130 is formed on the second insulation layer 174 and is overlapped with the switch 150. The third insulation layer 176 is formed on the second insulation layer 174 and overlays the shielding electrode 130. Considering the impedance of the pixel, the shielding electrode 130 is usually made of an opaque, conductive material.

The plane organic layer 180 is formed on the third insulation layer 176 such that the plane organic layer 180 is positioned over the date line 120, the scanning line 110 and the pixel area 105, and has no overlapping with the shielding electrode 130. The plane organic layer 180 is adapted for reducing parasitic capacitance induced between the pixel electrode 140 and the data line 120 and formed of an organic material having a dielectric constant in a range of about 0.5-3.7. The organic material includes, but not limited to, acryl organic compound, benzocyclobutene (BCB) or perfluorocyclobutene (PFCB).

The pixel electrode 140 is formed on the third insulation layer 176 and the plane organic layer 180. The pixel electrode 140 includes a first portion 142 overlapped with the shielding electrode 130, and a second portion 144 extending from the first portion 142. The first portion 142 is overlapped with the shielding electrode 130. The second portion 144 overlays the plane organic layer 180 and has no overlapping with the shielding electrode 130 and the data line 120. The pixel electrode 140 is made of a transparent, conductive material, such as indium zinc oxide (IZO), amorphous indium tin oxide (ITO), poly ITO, or the like.

According to the present invention, the switch 150 is formed inside the pixel area 105. The shielding electrode 130 and the first portion 142 of the pixel electrode 140 and the third insulation layer 176 between the shielding electrode 130 and the first portion 142 of the pixel electrode 140 are configured as a storage capacitor 160 to generate a storage capacitance, i.e., the storage capacitance area 160 is defined by the area of the shielding electrode 130 and the pixel electrode 140 and the third insulation layer 176 between the shielding electrode 130 and the pixel electrode 140 located over the switch 150.

The second portion 144 of the pixel electrode 140 overlays the plane organic layer 180 and has no overlapping with the shielding electrode 130 and the data line 120 and has no overlapping with the shielding electrode 130 and the date line 120, as shown in FIGS. 1a and 1c. Accordingly, the pixel area 105 can be optimally utilized to transmit light therethough the second portion 144 of the pixel electrode 140, thereby increasing the aperture ratio of the pixel. In addition, the plane organic layer 180 is adapted for reducing parasitic capacitance induced between the pixel electrode 140 and the data line 120, and no shielding electrode is overlapped with the data line 120, thus the power loading is reduced substantially, thereby lowering power consumption thereof.

In this exemplary embodiment, the switch 150 is formed inside the central region of the pixel area 105. In practice, the switch 150 can also be formed inside the other region of the pixel area 105.

Figure 2B:
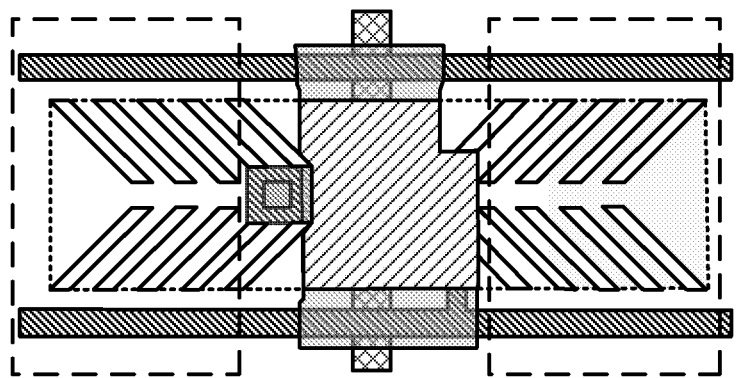
FIGS. 2*a* and 2*b* show schematically a top view and a top view with highlighting a storage capacitance of a pixel structure, respectively, according to another embodiment of the present invention.
Figure 2A:
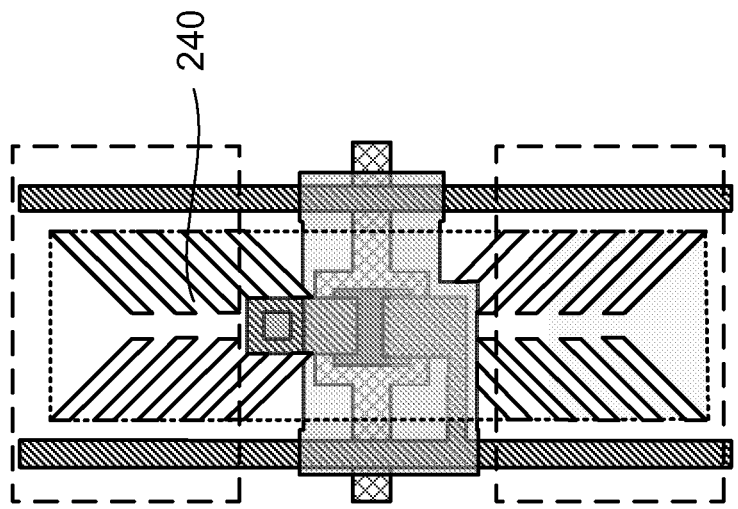
Figure 3A:
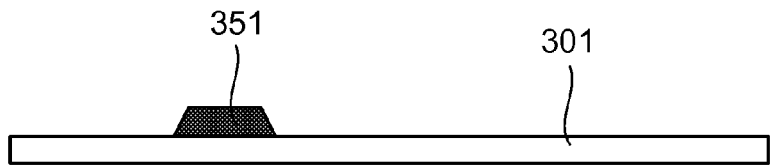
FIGS. 3*a*-3*i* show schematically cross-sectional views illustrating processes for fabricating the pixel structure of FIGS. 1*a*-1*c* along the A-A' and B-B' views.
Figure 3B:
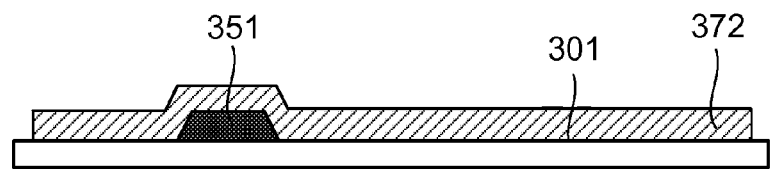
Figure 3C:
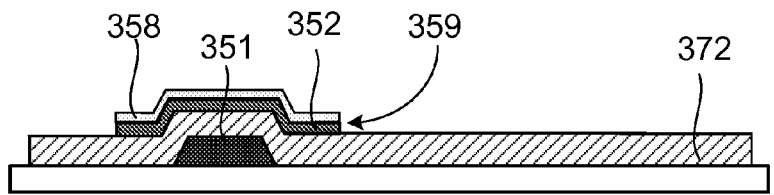
Figure 3D:
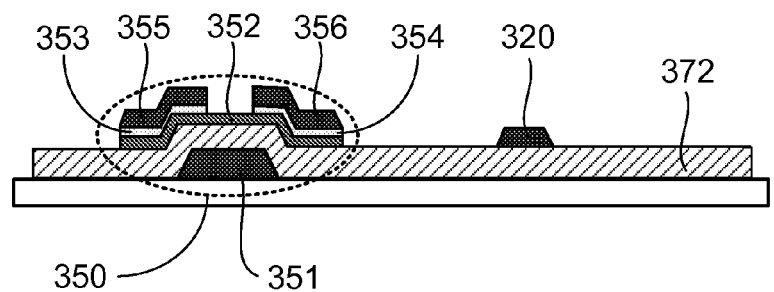
Figure 3E:
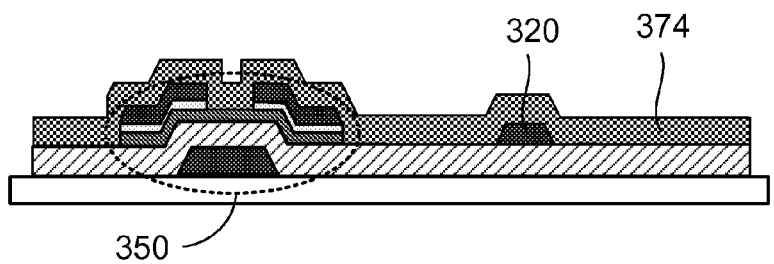
Figure 3F:
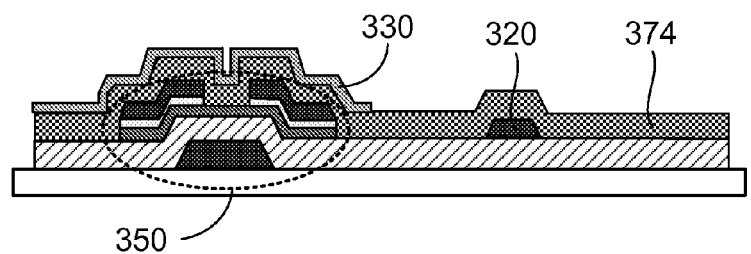
Figure 3G:
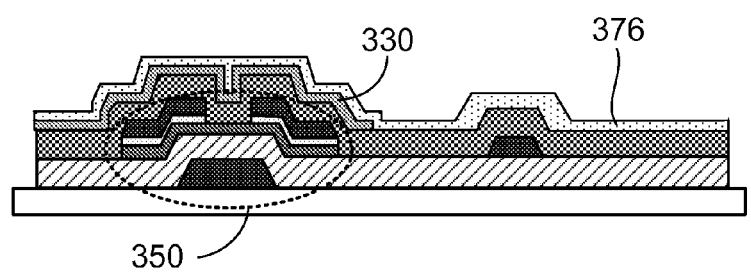
Figure 3H:
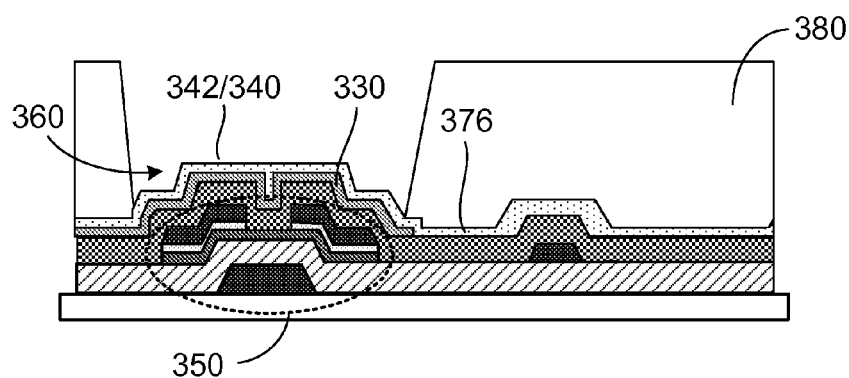
Figure 3I:
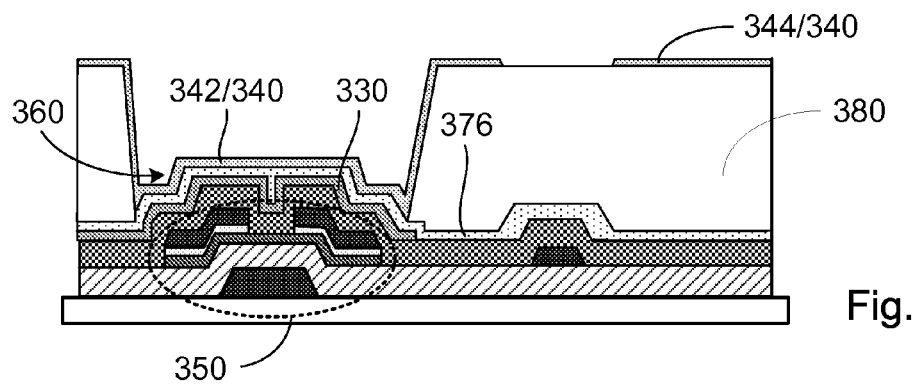

Referring to FIG. 2, a pixel structure 200 is shown according to another embodiment of the present invention. The pixel structure 200 is similar to the pixel structure 100 shown in FIGS. 1a-1c, excerpt that the pixel electrode 240 has a comb-like structure. Accordingly, for such a pixel structure 200, the aperture ratio of the pixel can be improved.

Referring to FIGS. 3a-3i and FIGS. 4a-4c, a method/process for fabricating a pixel structure is shown according to one embodiment of the present invention. The method includes the following steps: at first, a substrate 301 is provided. The first substrate 301 is formed of glass, plastic or the likes. Then, a scan line 310 and a gate electrode 351 are spatially formed on the substrate 301. The gate electrode 351 is formed of a metal such as Al, Mo, Cr, Ta, or alloy, and electrically connected to the scan line 310.

A first insulation layer (gate insulation layer) 372 is formed on the substrate 301, and overlays the scan line 310 and the gate electrode 351. The first insulation layer 372 is formed of SiNx, SiOx, or SiON.

Then, a semiconductor layer 359 is formed on the first insulation layer 372. The semiconductor layer 359 includes a channel layer 352 formed on the first insulation layer 372 and overlapped with the gate electrode 351, and an ohmic contact layer 358 formed on the channel layer 352 and patterned to have a first contact portion 353 and a second contact portion 354 separated from the first contact portion 353. The channel layer 352 can be formed of amorphous silicon (a-Si) or the like. The contact layer 358 can be formed of doped amorphous silicon such as $N^+$ doped a-Si. In one embodiment, the channel layer 352 and the contact layer 358 are formed in such a manner that the a-Si and the doped amorphous silicon ($N^+$ doped a-Si or $P^+$ doped a-Si) are successively deposited by PECVD and then patterned. Next, a data line 320 and a source electrode 355 and a drain electrode 356 are formed. The source electrode 355 and the drain electrode 356 are formed on the first portion 353 and the second portion 354 of the ohmic contact layer, respectively. In alternative steps, after forming the channel layer 352 and the ohmic contact layer 358, a step of pre-patterning the channel layer 352 and the ohmic contact layer 358 can be performed to define the shape of the channel layer 352. A step of patterning the channel layer 352 and the ohmic contact layer 358 can be performed after forming the source electrode 355 and the drain electrode 356, wherein the ohmic contact layer 358 is patterned to have a first contact portion 353 and a second contact portion 354 separated from the first contact portion 353, and the source electrode 355 and the drain electrode 356 are substantially in contact with the first contact portion 353 and the second contact portion 354 of the ohmic contact layer 358, respectively. In further alternative steps, a half-tone process is employed, the step of patterning the channel layer 352 and the ohmic contact layer 358 can be performed after forming the source electrode 355 and the drain electrode 356 with a half-tone mask, wherein the ohmic contact layer 358 is patterned to have the first contact portion 353 and the second portion 354 separated from the first contact portion 353, and the source electrode 355 and the drain electrode 356 are substantially in contact with the first contact portion 353 and the second contact portion 354 of the ohmic contact layer 358, respectively.

The source electrode 355 and the drain electrode 356 of the switch 350 are electrically connected to the data line 320 and the pixel electrode 340. The gate electrode 351, the gate insulation layer 372, the channel layer 352, the ohmic contact layer 358, the source electrode 355 and the drain electrode 356 define a switch 350, which corresponds to a TFT.

Afterwards, a second insulation layer 374 is formed on the first insulation layer 372 and overlays the data line 320 and the switch 350. Then, a shielding electrode 330 is formed on the second insulation layer 374. The shielding electrode 330 is overlapped with the switch 350. The shielding electrode 330 is formed of an opaque, conductive material.

The next step is to form a third insulation layer 376 on the second insulation layer 374, which overlays the shielding electrode 330.

Then, a plane organic layer 380 is formed on the third insulation layer 376 such that the plane organic layer is positioned over the date line 320, the scanning line 310 and the pixel area, and has no overlapping with the shielding electrode 330. The plane organic layer 380 is adapted for reducing parasitic capacitance induced between the pixel electrode 340 and the data line 320. The plane organic layer 380 includes an organic material having a dielectric constant in a range of about 0.5-3.7. The organic material includes, but not limited to, acryl organic compound, BCB or PFCB.

Figure 4A:
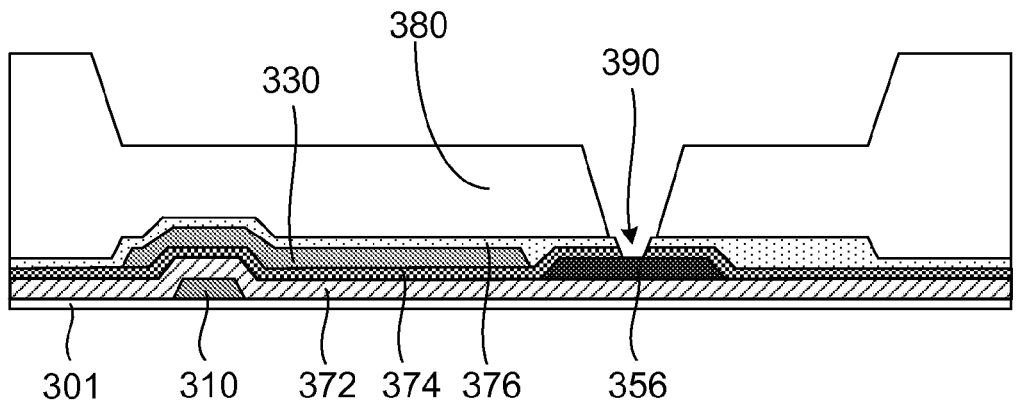
FIGS. 4*a*-4*c* show schematically cross-sectional views illustrating processes for fabricating the pixel structure of FIGS. 1*a*-1*c* along the C-C' view.
Figure 4B:
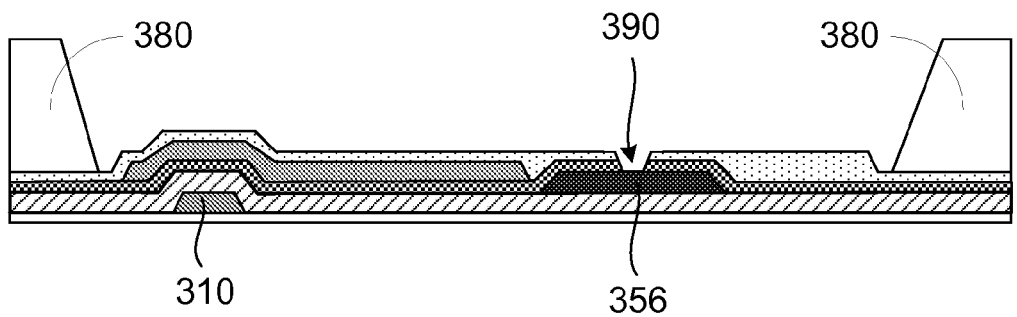
Figure 4C:
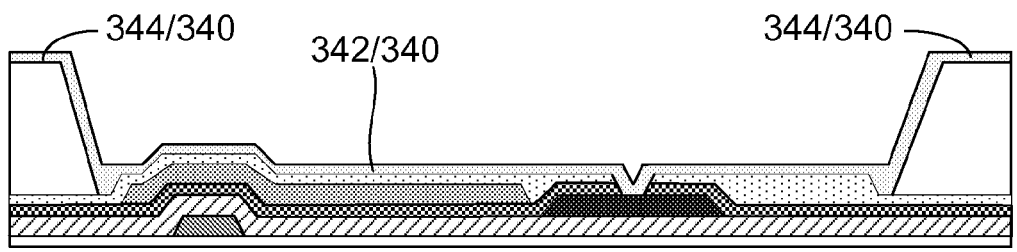
Figure 5:
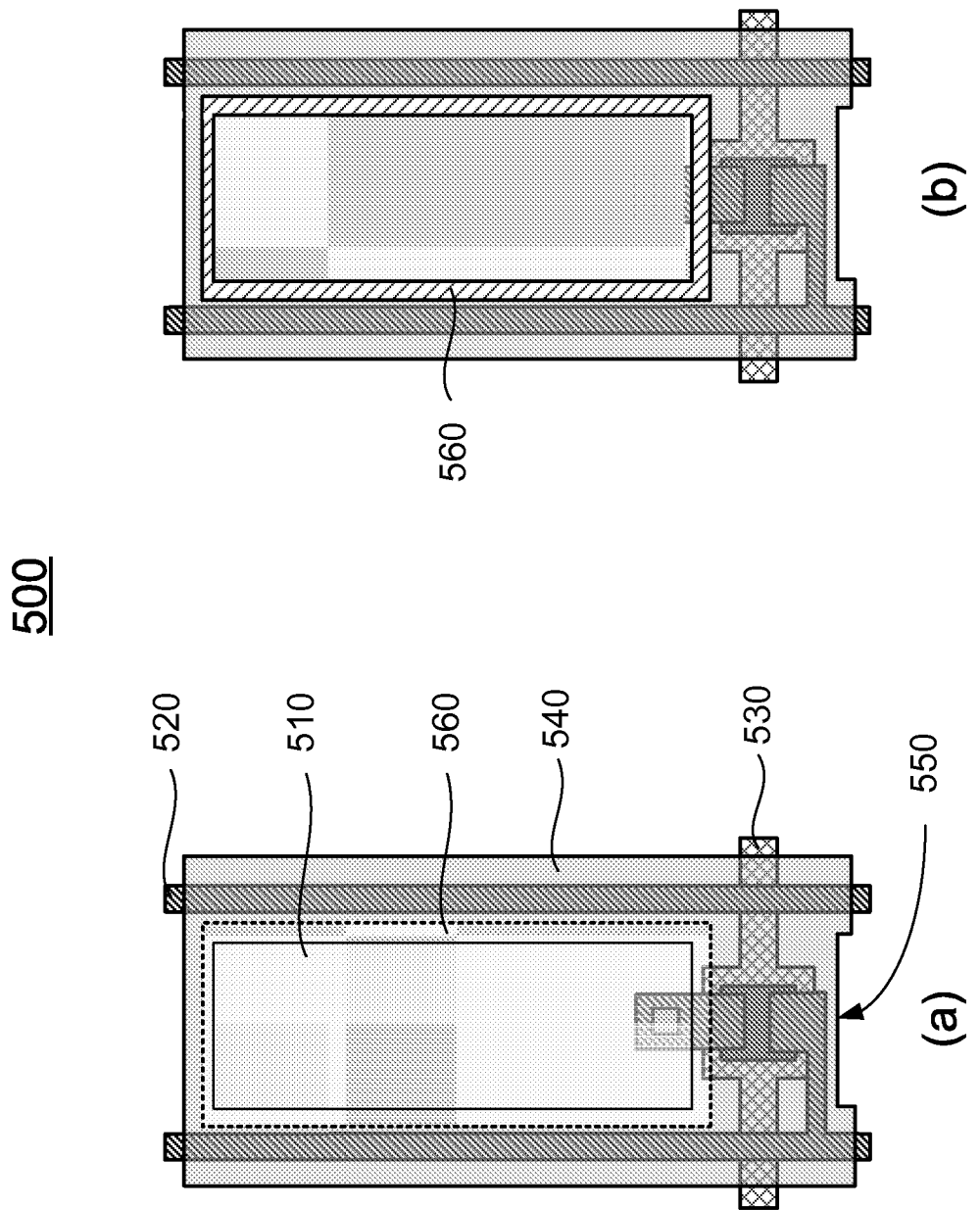
FIG. 5 shows schematically a conventional pixel structure, (a) a top view, and (b) a top view with highlighting a storage capacitance.
Figure 6:
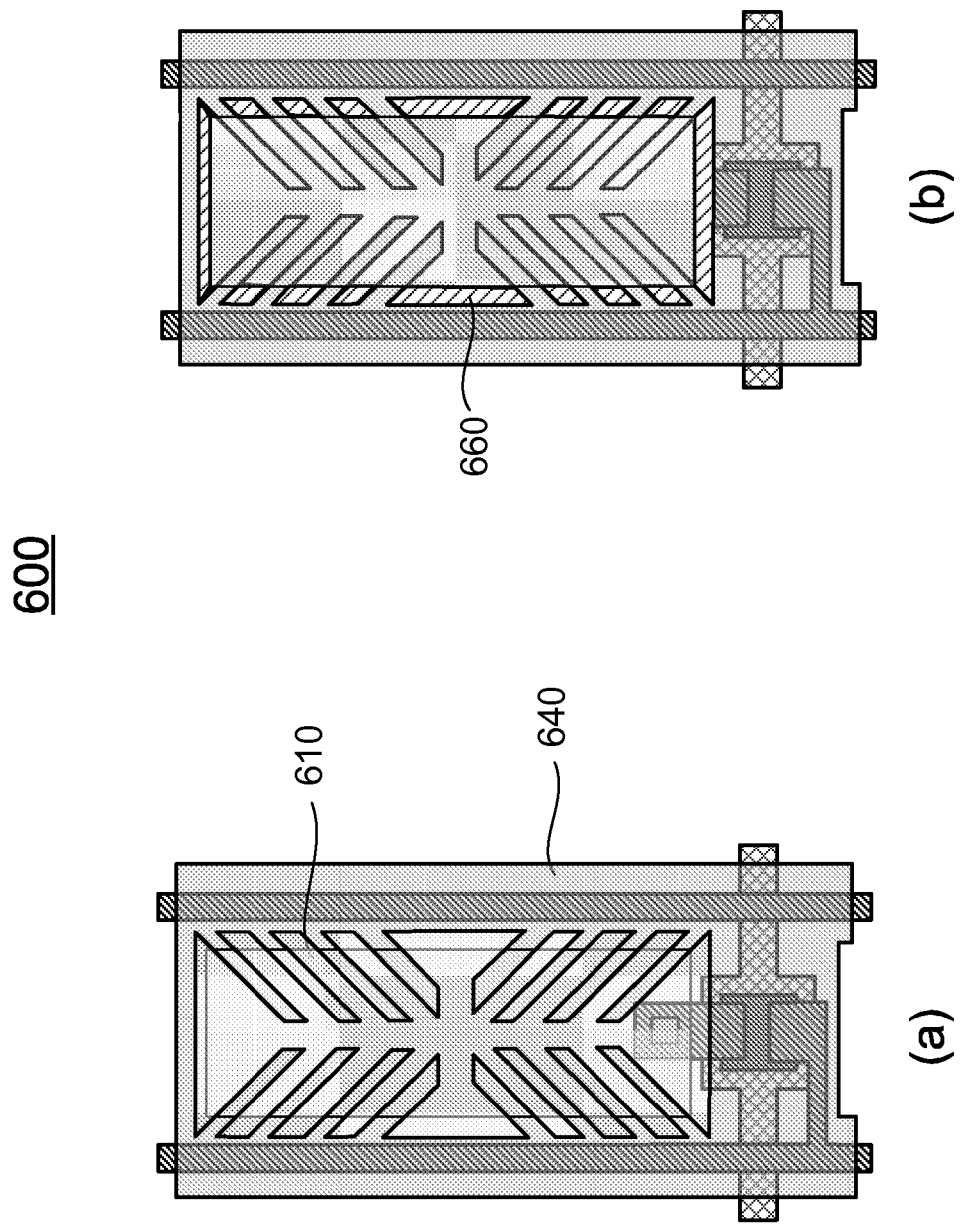
FIG. 6 shows schematically another conventional pixel structure, (a) a top view, and (b) a top view with highlighting a storage capacitance.

As shown in FIGS. 4a-4c, the plane organic layer 380 is formed on the third insulation layer 376 first. Then, the portion of the plane organic layer 380 over the shielding electrode 330 is etched off, so that the plane organic layer 380 has no overlapping with the shielding electrode 330. Additionally, the etching step may includes forming a via hole 390 through the second and third insulating layers 374 and 376 to expose the drain electrode 356, for connecting the drain electrode 356 and the pixel electrode 340, as shown in FIG. 4c.

Next, a pixel electrode 340 is formed on the third insulation layer 376 and the plane organic layer 380. The pixel electrode 340 has a first portion 342 and a second portion 344 extending from the first portion 342. The first portion 342 of the pixel electrode 340 is overlapped with the shielding electrode 330 so as to define a storage capacitor 360 with the third insulation layer 376 therebetween. The second portion 344 of the pixel electrode 340 is configured to have no overlapping area with the shielding electrode 330 and the data line 320. The pixel electrode 340 is made of a transparent, conductive material. For such a pixel structure, no shielding electrode is overlapped with the data line, thus the power loading is reduced substantially, which lowers power consumption thereof.

In sum, the present invention, among other things, recites a pixel structure having a switch, a shielding electrode, a plane organic layer and a pixel electrode formed inside the pixel area in a multilayered structure. The shielding electrode and the first portion of the pixel electrode located over the switch and the third insulation layer therebetween are configured as a storage capacitor to generate a storage capacitance. Furthermore, the second portion of the pixel electrode has no overlapping with the shielding electrode and the data line. Accordingly, the pixel area can be optimally utilized to transmit light therethough the pixel electrode, thereby increasing the aperture ratio of the pixel. In addition, the plane organic layer is adapted for reducing parasitic capacitance induced between the pixel electrode and the data line, and no shielding electrode is overlapped with the data line, thus the power loading is reduced substantially, thereby lowering power consumption thereof.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A pixel structure usable in a liquid crystal display (LCD), comprising:
  (a) a scan line formed on a substrate;
  (b) a data line formed over the substrate;
  (c) a pixel area associated with the scan line and the data line;
  (d) a switch formed inside the pixel area on the substrate;

(e) a shielding electrode formed over the switch;
(f) a plane organic layer formed over the date line and the pixel area and having no overlapping with the shielding electrode;
(g) a pixel electrode having a first portion and a second portion extending from the first portion, and formed over the shielding electrode and the plane organic layer in the pixel area, wherein the first portion is overlapped with the shielding electrode so as to define a storage capacitor therebetween, and the second portion overlays the plane organic layer and has no overlapping with the data line;
(h) a first insulation layer formed between the scan line and the data line;
(i) a second insulation layer formed between the data line and the shielding electrode; and
(j) a third insulation layer formed between the shielding electrode and the pixel electrode,
wherein the switch has a gate, a source and a drain electrically connected to the scan line, the data line and the pixel electrode, respectively.

2. The pixel structure of claim 1, wherein the gate of the switch is formed on the substrate, and the source and drain of the switch are formed between the first insulation layer and the second insulation layer.

3. The pixel structure of claim 2, wherein the switch further comprises a semiconductor layer formed between the source and drain and the first insulation layer.

4. The pixel structure of claim 3, wherein the semiconductor layer comprises a channel layer formed on the first insulation layer and an ohmic contact layer formed on the channel layer.

5. The pixel structure of claim 4, wherein the channel layer is formed of amorphous silicon (a-Si), and wherein the ohmic contact layer is formed of an $N^+$ doped or CVD deposited semiconductor.

6. The pixel structure of claim 1, wherein the switch comprises a thin film transistor.

7. The pixel structure of claim 1, wherein the plane organic layer is adapted for reducing parasitic capacitance induced between the pixel electrode and the data line.

8. The pixel structure of claim 7, wherein the plane organic layer is formed of an organic material having a dielectric constant in a range of about 0.5-3.7.

9. The pixel structure of claim 1, wherein the shielding electrode is formed of an opaque, conductive material.

10. The pixel structure of claim 1, wherein the pixel electrode has a comb-like shape.

11. The pixel structure of claim 1, wherein the pixel electrode is made of a transparent, conductive material.

12. A liquid crystal display (LCD) comprising a plurality of the pixel structures of claim 1, arranged in a matrix.

* * * * *